United States Patent [19]

Suzuki

[11] Patent Number: 5,196,362

[45] Date of Patent: Mar. 23, 1993

[54] MULTILAYER WIRING METHOD OF ON-CHIP MODIFICATION FOR AN LSI

[75] Inventor: Katsuyoshi Suzuki, Hadano, Japan

[73] Assignee: Hitachi, Ltd., Tokyo, Japan

[21] Appl. No.: 749,269

[22] Filed: Aug. 23, 1991

[30] Foreign Application Priority Data

Aug. 28, 1990 [JP] Japan .................................. 2-228770

[51] Int. Cl.$^5$ ............................................ H01L 21/80
[52] U.S. Cl. ...................................... 437/51; 437/195; 437/923
[58] Field of Search ................... 437/48, 51, 189, 190, 437/195, 922, 923, 935, 173

[56] References Cited

U.S. PATENT DOCUMENTS

| | | | |
|---|---|---|---|
| 4,259,367 | 3/1981 | Dougherty, Jr. | 437/923 |
| 4,609,809 | 9/1986 | Yamaguchi et al. | 204/192.34 |
| 4,868,068 | 9/1989 | Yamaguchi et al. | 437/195 |
| 4,900,695 | 2/1990 | Takahashi et al. | 437/195 |
| 5,043,297 | 8/1991 | Suzuki et al. | 437/51 |

FOREIGN PATENT DOCUMENTS

| | | |
|---|---|---|
| 0314376 | 5/1989 | European Pat. Off. . |
| 62-229956 | 10/1987 | Japan . |
| 62-298134 | 12/1987 | Japan . |

*Primary Examiner*—Brian E. Hearn
*Assistant Examiner*—C. Chaudhari
*Attorney, Agent, or Firm*—Kenyon & Kenyon

[57] ABSTRACT

In interconnecting signal wires between circuit elements of a semiconductor integrated circuit chip having a multilayered wiring structure, the signal wires are divided or classified into a first group of signal wires with lower modification-requisite possibilty and a second group of signal wires with higher modification-requisite possibility. The first group of signal wires are allocated to a lower wiring layer and wired therein. Then, the second group of signal wires are allocated to an upper wiring layer and wired therein. The second group of signal wires are allocated to and connected in the upper wiring layer, so that a laser is allowed to be fired directly to the upper wiring layer for disconnecting the signal wire or a laser CVD is allowed to be easily implemented on the upper wiring layer for connecting the signal wire, thereby enhancing reliability of modification. The first group of signal wires not to be modified are allocated to and connected in the lower wiring layer. Those signal wires not to be modified thus do not become any obstacle to the connecting area of the upper wiring layers, thereby allowing efficient use of the wiring channels.

7 Claims, 4 Drawing Sheets

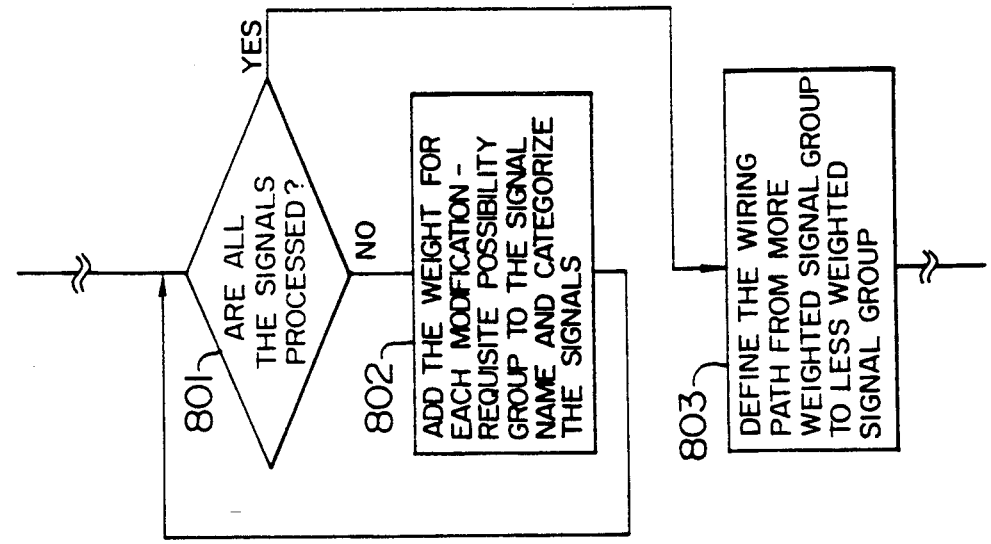
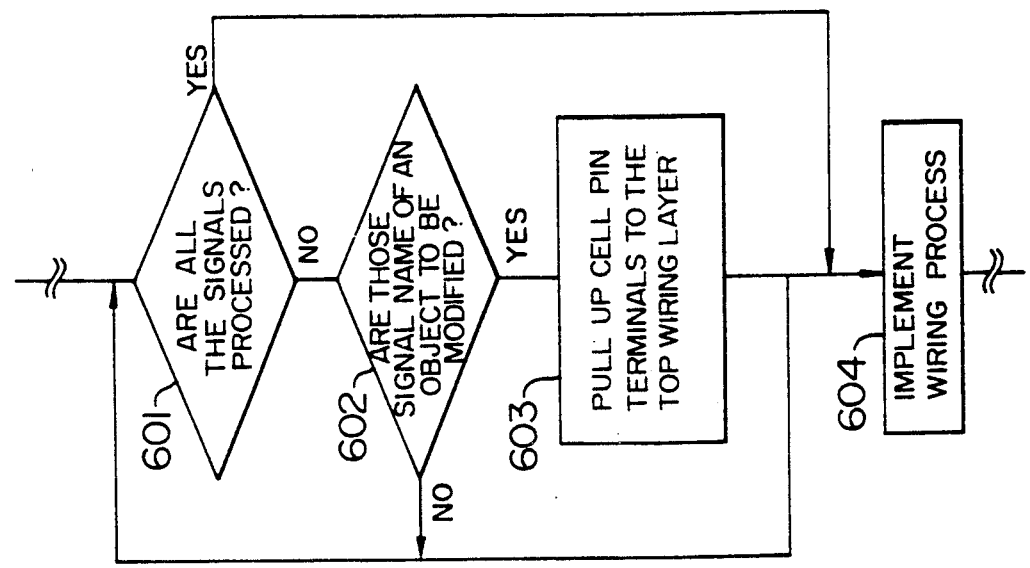

MULTILAYER WIRING METHOD OF ON-CHIP MODIFICATION FOR AN LSI

CROSS-REFERENCE TO THE RELATED APPLICATION

This application relates to an application U.S. Ser. No. 07/661466 filed Feb. 26, 1991 by Katsuyoshi SUZUKI, Tatsuki ISHI and Takahiko TAKAHASHI assigned to the present assignee, the contents of which are incorporated herein by reference.

BACKGROUND OF THE INVENTION

The present invention relates to a wiring technique to be implemented in a semiconductor integrated circuit having a plurality of wiring layers, and more particularly to a multilayer wiring method of wiring those signal wires having high modification-requisite possibility among signal wires permitted to modify using an upper wiring layer or layers in a semiconductor integrated circuit chip (LSI) for the purpose of facilitating change of wires for modification or repair of the LSI therein.

The logical circuit mounted on a semiconductor integrated circuit chip used for arranging a logical unit such as a computer circuit has often required change of logic arrangement under development of the logical circuit. The change of the logical arrangement mounted on an LSI chip is carried out by changing wiring patterns of aluminium wires between logical gates wired in two or more layers in a manner to cover the top of the LSI chip.

This type of change of logical arrangement has often required a slight change such as change of part of a signal wire only. Just for the change of wiring patterns, however, it takes too much time to remanufacture an LSI chip. For modification a of portion of a signal wire, therefore, a technique has been developed of disconnecting unnecessary wires by applying a laser or a focused ion beam on the top of the manufactured LSI chip and connecting signal wires of a wiring layer mounted on the LSI chip by means of laser chemical vapor deposition (referred to as CVD) or a focused ion beam CVD method (see JP-A-62-229956).

Further, as described in JP-A-62-298134, for the purpose of facilitating modification or repair of wiring on an LSI chip, there has been proposed a technique of providing a spare wire between the logical gates and modifying or repairing the wiring connection by using the spare wire. This technique is designed so that a conductive layer is provided on the same layer level as the upper-layer spare wire on a lower-layer spare wire near a crossing portion between a lower-layer spare wire and an upper-layer spare wire and the conductive layer is connected to the lower-layer spare wire. This design results in making it possible to form a more shallow connecting hole for modifying connection between the lower-layer spare wire and the upper-layer spare wire, thereby improving reliability about the modification.

The foregoing prior art, however, is required to pull up parts of all the wiring patterns to an upper layer for enhancing the reliability about modified or repaired wiring of an LSI chip. Since the LSI chip normally provides cell terminals in the bottom layer of the wiring layers, it is necessary to pull up the wiring patterns through through-holes at one time or in a one-layer-by-one-layer manner from the bottom layer.

In case of employing the method of leading the wiring patterns out through the through-holes, it is quite difficult for the current manufacturing process of the semiconductor integrated circuit to create the through-hole in the chip, in particular, more difficult if more wiring layers such as four layers are formed, often resulting in the lowering of reliability and a yield of the semiconductor integrated circuit. In general, therefore, another method has been employed of leading signal wires out to the top layer in a one-layer-by-one-layer manner from a bottom layer.

The main cause of increasing the wiring layers of an LSI chip in number is to secure the wiring channels against the logical gates packed on a small area. However, if parts of all the wiring patterns are led out to the top layer as stated above, it is substantially the same as taking a roundabout way and thus consumes the wiring channels wastefully. It results in disadvantageously bringing about an unwired state of necessary wires.

The modification of the LSI does not require all the signal wires to be modified. In principle, clock-system wires such as clock supply signal lines are not required to be modified, because the modification of the clock-system wires brings about the change of timing about signal delays between the logical gates and will not provide sufficient performance. Of the signal wires, there exist such signal wires which do not need to be modified.

SUMMARY OF THE INVENTION

It is an object of the present invention to provide a multilayer wiring method of laying out only a group of signal wires of high modification-requisite possibility in an upper wiring layer of a semiconductor integrated circuit chip to facilitate an on-chip wiring modification.

To achieve the above object in a preferred mode, a multilayer wiring method for mounting signal wires in a plurality of layers in a multi-layered form between circuit cells of the semiconductor integrated circuit having multilayered wires, comprises the steps of dividing the signal wires into a first group of signal wires of lower modification-requisite possibility and a second group of signal wires of higher modification-requisite possibility, allocating the signal wires of the first group to at least a lower layer of the plurality of wiring layers and wiring them therein, and allocating the signal wires of the second group to at least an upper layer of the plurality of wiring layers and wiring them therein.

In the case where signal wires between the cell terminals of the circuit element of the semiconductor integrated circuit are allocated on two or more wiring layers and each wiring layer is allocated to each signal wiring type in a multilayered manner, the signal wires are classified into the first group of signal wires of low modification-requisite possibility and the second group of signal wires of high modification-requisite possibility. The cell terminals of the signal wires included in the first group and the unused cell terminals are laid and wired on at least one lower layer of the wiring layers. The cell terminals of the signal wires included in the second group are led out up to at least one upper layer of the wiring layers and are wired therein.

In the case where signal wires between the circuit elements provided in the semiconductor integrated circuit having a plurality of wiring layers in a multilayer form are allocated in the wiring layers, the signal wires are classified into a first group of signal wires of low modification-requisite possibility or modification-prohibited type and a second group of signal wires of high modification-requisite possibility or modification-permitted type. The signal wires included in the first group are allocated to at least one lower layer of the wiring layers and are wired therein. The signal wires included in the second group are allocated to at least one upper layer of the wiring layers and are wired therein.

The signal wires included in the second signal wire group to be modified are allocated to the upper layer of the wiring layers. It is therefore possible to cut off or disconnect the signal wires by applying a laser beam and to connect the signal wires by a laser CVD method on the top wiring layer, resulting in enhancement of the reliability of the on-chip wiring modification. Further, since the signal wires included in the first signal wiring group of modification-prohibited type are allocated to the lower layer of the wiring layers, those signal wires are not obstacles to the wiring area of the upper wiring layer, resulting in efficient use of the wiring channels.

In the case where signal wires between the cell terminals of the circuit elements included in the semiconductor integrated circuit are connected in a wiring multilayer in a multilayered manner and are allocated to a corresponding wiring layer of multilayer for each type of wiring, the signal wires are classified into the first group of signal wires of low modification-requisite possibility or modification-prohibited type and the second group of signal wires of high modification-requisite possibility or modification-permitted type on each wiring layer for the corresponding type of signal wiring. The cell terminals of the signal wires included in the first group and the unused cell terminals are laid and wired on the lower layer of the wiring multilayer. The cell terminals of the signal wires included in the second group are led out to the upper layer of the wiring multilayer and wired therein.

Hence, after the cell terminals of signal wires of high modification-requisite possibility included in the second group are led out to the upper layer of the wiring multilayer and the cell terminals of signal wires of low modification-requisite possibility included in the first group and an available cell terminal are left in the lower layer, wiring is implemented on each wiring layer. As a result of doing the wiring on each wiring layer, since signal wires of high modification-requisite possibility are wired on the upper layer of the wiring layers, it is possible to disconnect the signal wires by applying a laser or to connect the signal wires by laser CVD method on the upper layer of the wiring layers, thereby enhancing reliability of on-chip wiring modification.

BRIEF DESCRIPTION OF THE DRAWINGS

FIGS. 4 and 5 are views for explaining an LSI modifying or repairing technique implemented by a laser CVD method or the like;

FIG. 6 is a flow chart showing the process implemented according to the first embodiment of the present invention;

FIG. 8 is a flow chart showing a process implemented according to a second embodiment of the present invention.

DESCRIPTION OF THE PREFERRED EMBODIMENTS

Hereafter, a first embodiment of the present invention will be described with reference to the drawings.

Figure 1:
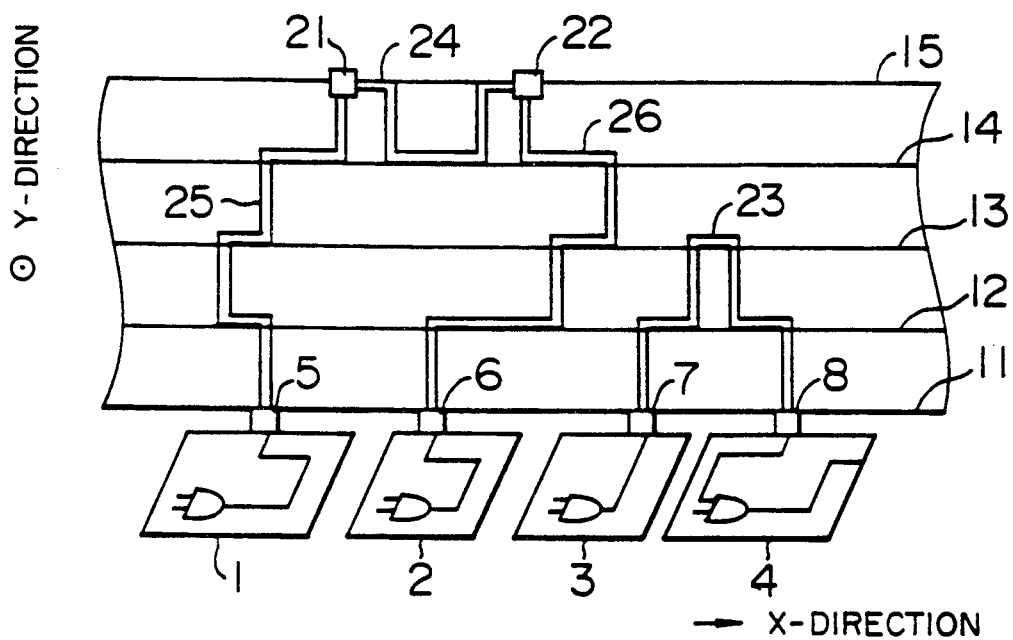
FIG. 1 is a partial section showing a multilayer wiring state of a semiconductor integrated circuit chip to which a multilayer wiring method according to a first embodiment of the invention is applied.

FIG. 1 shows in partial section a multilayer wiring in a semiconductor integrated circuit chip according to the first embodiment of the present invention. As shown, each of reference numerals 1, 2, 3 and 4 denotes a logical gate which is one of the circuit elements included in the semiconductor integrated circuit. Numerals 5, 6, 7 and 8 each denotes a cell terminal to which a signal wire of each logical gate is connected. Reference numerals 11, 12, 13, 14 and 15 each denotes a wiring layer formed in a manner to cover the top of the logical gate layers formed on the semiconductor integrated circuit chip (substrate). As shown, five wiring layers are formed in this embodiment.

In the implementation, the wiring layer 11 provides only cell pin terminals respectively dedicated to the logical gates and no wiring mounted thereon. The wiring layers 12 and 14 provide wiring paths formed in an x-axis direction and the layers 13 and 15 provide wiring paths formed in a y-axis direction. Between the adjacent wiring layers is formed a through hole serving to connect the adjacent layers only.

Reference numerals 21 and 22 denote cell terminals which are results of pulling up the cell terminals 5 and 6 of the logical gates of the bottom layer to the top layer of the wiring layers.

With reference to FIG. 1, description will be made of the implementation where five wiring layers are provided on the semiconductor integrated circuit chip. In the case of implementing multilayer wiring, the signal wires to be wired are categorized and divided into wires which may be wiring-modified (that is, signal wires with high modification-requisite possibility) and wires which should not be modified (that is, signal wires with low modification-requisite possibility). For simplicity, the former and latter wires are referred to as "wires to be modified" and "wires not to be modified", respectively. The cell terminals connected to the wires to be modified are then pulled out from the bottom layer having the logical gates formed thereon to the top layer. The cell terminals of the wires not to be modified are left laid on the bottom layer. In this state, an automatic wiring process is carried out by means of a channel allocating method or a labyrinth method. In this process, the wiring between the cell terminals of the wires not to be modified is implemented on the bottom wiring layer and the wires to be modified are, in part, pulled out to an upper layer on which those wires are wired. As a result, it becomes possible to efficiently use the wiring channels, that is, realize the complete wiring. Since the wires to be modified are, in part, pulled out to the top layer, an easily modifiable wiring arrangement is made possible.

By way of example, a wire with high modification-requisite possibility is assumed as a signal wire connecting between the cell terminal 5 of the logical gate 1 and the cell terminal 6 of the logical gate 2. A wire with low modification-requisite possibility is assumed as a signal wire connecting between the cell terminal 7 of the logical gate 3 and the cell terminal 8 of the logical gate 4. The wire with low modification-requisite possibility is a wire such as a clock-system signal wire. In implementing the multilayer wiring, at first, the signal wires are categorized and divided into a first group of wires with low modification-requisite possibility and a second group of wires with high modification-requisite possibility. Next, a wire 25 is formed for leading out or pulling up to the top layer the cell terminal 5 of the logical gate 1 connected to the second group wire and the wire 25 is led to the corresponding cell terminal 21 formed on the fifth layer 15. A wire 26 is formed for pulling up to the top layer the cell terminal 6 of the logical gate 2 connected to the second groups wire and the wire 26 is led to the corresponding cell terminal 22 formed on the fifth layer 15.

The cell terminals 7 and 8 are left on the bottom layer, that is, the first layer. A signal wire 23 between the cell terminals 7 and 8 is automatically realized based on a wiring algorithm. With this wiring algorithm, the signal wire 23 is laid in the first to the third layers 11–13 only. Hence, wasteful use of the fourth and the fifth layers 14–15 is avoidable.

Next, a signal wire is formed between the cell terminal 5 of the logical gate 1 and the cell terminal 6 of the logical gate 2. It results in forming the wiring connection between the cell terminal 21 pulled up from the cell terminal 5 to the top layer and the cell terminal 22 pulled up from the cell terminal 6 to the top layer. The wiring between the cell terminals 21 and 22 is automatically realized in accordance with the wiring algorithm. With this wiring algorithm, the resulting wiring is a wire 24 formed in the fourth and the fifth layers 14–15 only. Hence, the wire 24 is a signal wire which is, in part, formed in the fifth layer 15, that is, the top layer. This part of the wire 24 formed in the top layer makes it possible to easily modify the LSI on the semiconductor integrated circuit chip.

Figure 2:
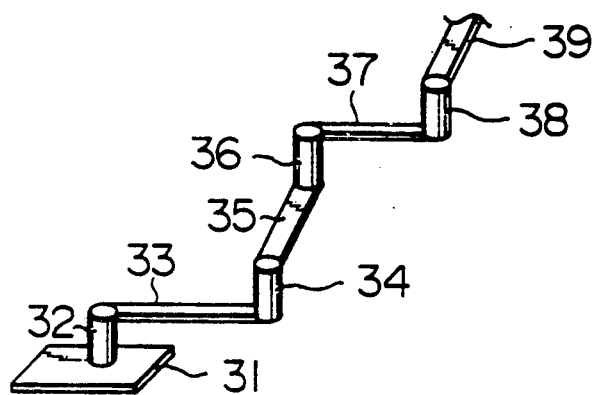
FIG. 2 is a view for explaining a pull-up wiring path for pulling up or leading out a cell terminal from the bottom layer to the top layer in a wiring multilayer.

FIG. 2 is a view showing a pull-up wiring path for pulling up the cell terminal from the bottom layer to the top layer. In case of using the five layers as in FIG. 1, the wiring path is led from the cell terminal 31 to the second layer 12 through a through hole 32, passed along the wire 33 in the second layer, goes up to the third layer 13 through a through hole 34, and is passed along the wire 35 in the third layer. Then, the wiring path goes up to the fourth layer 14 through a through hole 36 and is passed along the wire 37 in the fourth layer, goes up to the fifth layer 15 through a through hole 38, and is led to the wire 39 in the fifth layer 15. That is, from the bottom layer to the top layer, the cell terminal is pulled up one layer by one layer.

The pull-up wiring path is arranged using wiring patterns held in a library, which makes the wiring processing easy.

Figure 3:
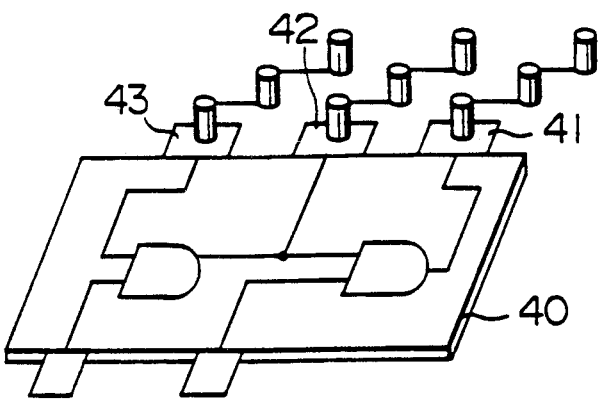
FIG. 3 is a diagram schematically showing wiring implementation on which the wire is pulled up from a cell terminal of a circuit element to the top layer through a fixed wiring pattern.

FIG. 3 diagrammatically shows wiring implementation on which a cell terminal of a circuit element is pulled up to the top layer along a fixed wiring pattern. In the multilayer wiring method, the cell terminal connected to the signal wire to be modified is designed to be pulled up to the top layer before starting the wiring process. This pull-up wiring pattern is held in a library and is picked out of the library when the pull-up wiring is carried out. As shown in FIG. 3, the pull-up wires lead from the cell terminals 41, 42, 43 of the logical gate 40, that is, a circuit element formed on the top layer is expanded to the top layer along the same wiring pattern. These pull-up wires are in parallel to one another, thereby easily and efficiently implementing the wiring without crossing the wiring paths. The cell terminals 41, 42, 43 are pulled up to the top layer at first and then the necessary wiring of the cell terminals 41, 42, 43 is carried out in the fourth and the fifth layers. The usable cell terminals are not expanded to the top layer along the wiring pattern. It means that the waste of the wiring channels is avoidable.

In the implementation of the multilayer wiring process, the cell terminals are all pulled up to the top layer and then the cell terminals are connected to each other. It is, therefore, possible to specify the wiring between both of the cell terminals in the fifth and the fourth layers only. As a result, most of the signal wires to be modified can be wired on the upper layers. On the other hand, no pull-up wiring process is carried out to the cell terminals of the signal wires not to be modified, and as a result, signal wires not to be modified can be wired on the lower layers. For such wiring process, it becomes possible to use the known wiring algorithm designed for two or three layers which has been conventionally employed. The possible use of the conventional wiring algorithm has some advantages of eliminating the necessity of using a newly sophisticated algorithm designed for a multilayer such as four or five layers, simplifying the wiring process, and increasing the processing speed.

In the foregoing embodiment, the cell terminal is led out to the top layer, that is, the fifth layer before starting the wiring of the signal wires to be modified. Alternatively, after the cell terminals are pulled up to the third layer, it is possible to specify the third layer and its upper layers, that is, the fourth and the fifth layers as the usable layers for connecting the cell terminals with each other. For connecting the cell terminals of the signal wires not to be modified, it is possible to specify the first to the third layers as the usable layers. This alternative example has an advantage of providing a more efficient wiring process, because the obstacles included in the fourth and the fifth layers are reduced in number as a result of specifying the third layer as the pull-up layer of the cell terminals.

Figure 7:
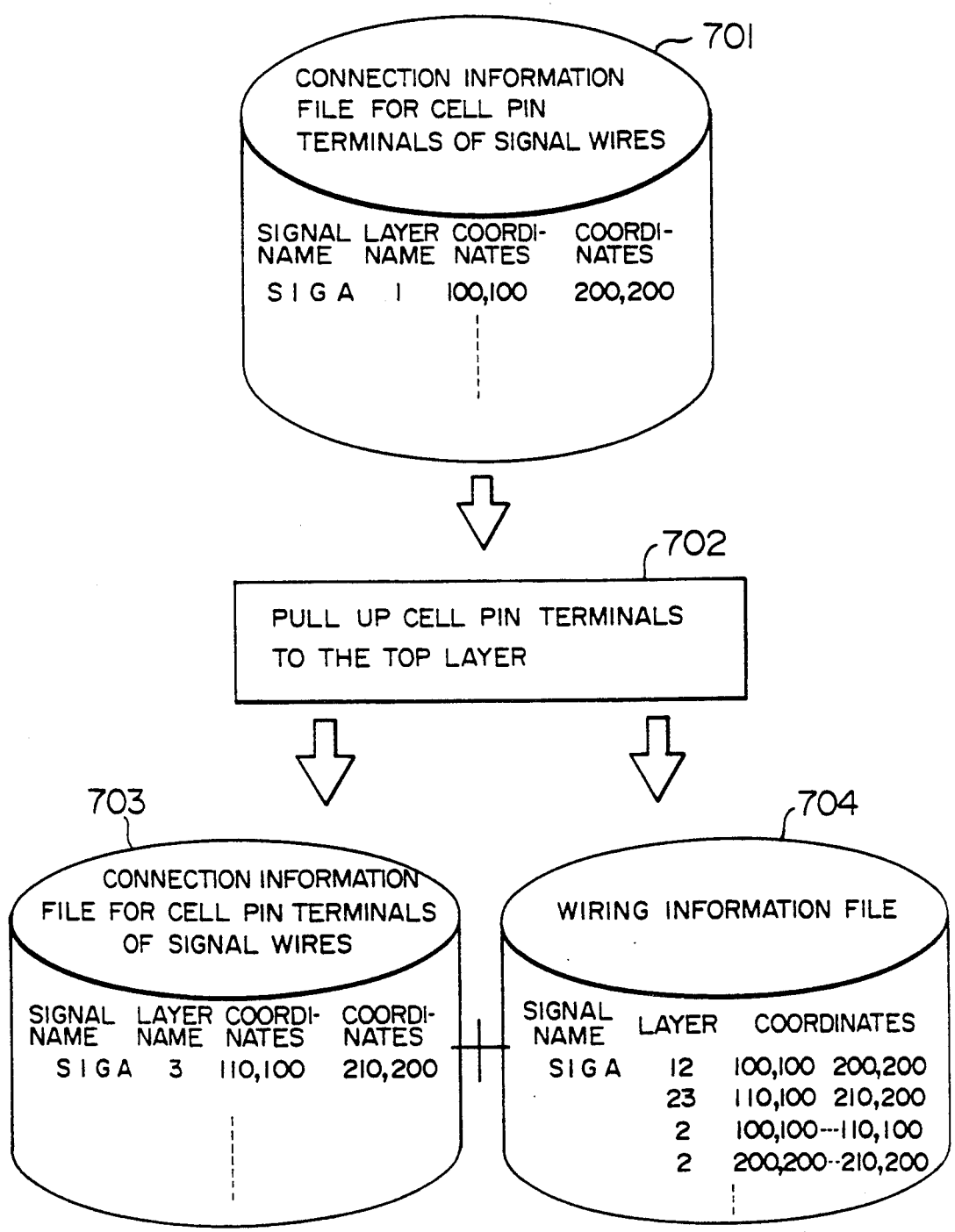
FIG. 7 is a diagram illustrating an input and output relation of a process implemented according to the first embodiment of the present invention.

The foregoing embodiment is depicted in accordance with the processing flowchart of FIG. 6. A processing before starting of the automatic wiring is to determine whether or not each signal wire (step 601) is to be modified (step 602). If it is affirmative (step 603), the cell pin terminal of the relevant signal wire is pulled up to the top wiring layer. This pull-up process is implemented as shown in FIG. 7. Taking an example of three-layered wiring, a connecting information file 701 for connecting cell pin terminals of the signal wires is prepared as an input file. This information file stores as logical connection data the information describing that the pin connection named as a SIGA signal is composed of a first layer pin of (100, 100) and another first layer pin of (200, 200) in the X-Y coordinate system. By pulling up the pin from the first layer to the third layer 702, the connection information file 703 for connecting the cell pin terminals of the signal wires changes the stored information to the information describing that the pin coordinate is (110, 100) and (210, 200) at the third layer. In addition, a file 704 is created as a wiring information file for storing the wiring information for connecting the pre-processing pin coordinate to the post-processing pin coordinate with each other. With respect to the SIGA signal, the file 704 serves to generate and store the coordinates (100, 100) and (200, 200) of the through hole connecting between the first layer and the second layer, the coordinates (100, 100) to (110, 100) and (200, 200) to (210, 200) on the second layer, and the coordinates (110, 100) and (210, 200) of the through holes connecting between the second and the third layers. No pull-up processing is performed for the signal wires not to be modified Those processes are performed on all the signal names and then the conventional automatic wiring processing (step 604) is started.

FIG. 8 shows processing steps implemented in a second embodiment of the present invention. Before doing the automatic wiring, it is determined which of the groups all the signals (step 801) belong to. The weight of each group is added to the corresponding signals so that all the signals are allowed to be categorized into the corresponding groups (step 802). It is assumed that a higher weight is added to signal wires to be modified. When the actual wiring path is allocated in the automatic wiring process, the allocation is being implemented in sequence from a higher weighted signal wire group and a higher layer (step 803) to a lower weighted group and a lower layer. By defining the wiring path in the above manner, the wiring area is buried from the upper layer to the lower layer in such a manner that a signal wire group to be modified is allocated to an upper layer and a signal wire group not to be modified is allocated to a lower layer.

Description will be directed to the on-chip wiring modification technique of how a logic is changed in the semiconductor integrated circuit chip having two or more wiring layers where the wires to be modified are wired on part of the top layer.

The LSI modify technique is a technique in which part of a wire provided on a semiconductor integrated circuit chip is connected or disconnected from the top of the chip by means of a focused ion beam or a laser CVD method after manufacturing of a semiconductor integrated circuit chip to thereby debug or correct a defective portion of an LSI.

Figure 4:
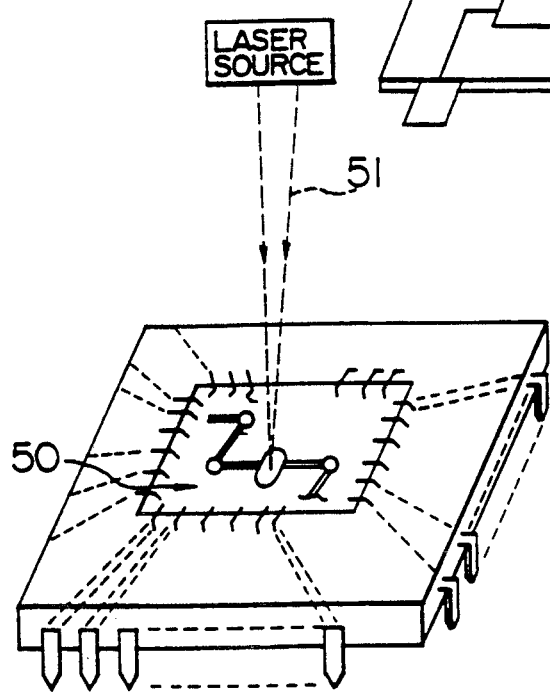
Figure 5:
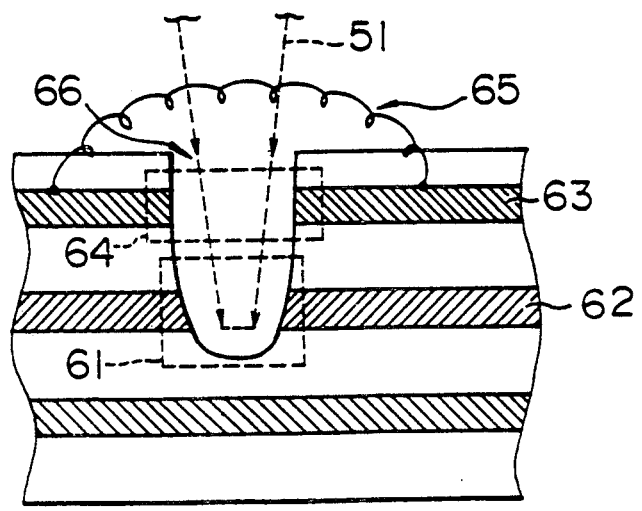

Turning to FIGS. 4 and 5, LSI modification techniques based on a laser CVD will be described.

As shown in FIG. 4, LSI modification is performed by applying a laser beam (focused ion beam) 51 to the manufactured semiconductor integrated circuit chip 50 from the top. It is advantageous that the points to be modified are located on the top layer of the semiconductor integrated circuit chip 50 for the purpose of reducing the obstacles in number, enhancing the working accuracy, and thereby improving the yield.

A previous method of modifying an LSI is described in U.S. Pat. No. 5,043,297 to Suzuki et al. This method is described herein in reference to FIG. 5. As shown in FIG. 5, in disconnecting the modification point 61 located in a wiring layer 62 which is one lower than the top wiring layer 63, the top wiring layer 63 is an obstacle. It is, therefore, necessary to disconnect the portion 64 of the top wiring layer 63 immediately above the modification point 61 by applying a laser beam for disconnecting the subject modification point 61. After disconnecting the portions 64 and 61, naturally, it is necessary to reconnect the portion 64 which is undesirably disconnected. The LSI modification for connection has to be done. For this type of LSI modification, for example, it is possible to provide a modified signal path 65 as an electric connecting path. This modified signal wiring path 65 is formed by means of a laser CVD or a focused ion beam CVD.

In general, even if no obstacle of the signal wiring portion is located in the top layer, the hole 66 of the modification point formed by applying a laser is made larger in diameter than the hole formed when working the wiring layer on the top layer as the modification point becomes deeper. It results in greatly limiting the area modification point for lessening the adverse effect on the area around the modification point.

In general, therefore, it is desirable to implement the LSI modification of the present invention at the wiring point of the top layer. In case of the multilayer interconnection, a part of the wiring pattern is pulled up to the top layer based on the automatic wiring algorithm.

When pulling up the wiring pattern to the top layer, the wiring pattern is pulled up one layer by one layer in sequence. Hence, in case all the wiring patterns are pulled up to the top layer, it results in all the wiring patterns passing through all the layers, thus making a roundabout. It means that the wiring channels are wasted. In addition, the lack of the wiring channel brings about the unwired state or prevents any wire from being pulled up to the top layer.

For the LSI modification, the clock-system or scan-system wiring patterns need adjustment of a delay value and are subject to the strict electric constraint conditions. Hence, the modification may result in breaking these constraint conditions. In case of changing logic, therefore, the clock-system or the scan-system wiring patterns are redesigned at an initial phase without performing the modification of such wiring patterns.

In the multilayer wiring method described herein, therefore, a set of signal wiring patterns such as clock-system and scan-system wiring patterns are treated as a first group of wires with low modification-requisite possibility and the other signal wiring patterns are treated as a second group of wires with high modification-requisite possibility.

In case of performing the wiring process, the wiring layer to which the cell terminals are pulled up is defined in a manner to make the most effective use of the channel in the light of a virtual wiring length ratio of a second-group wire to a first group wire and the channel of each layer.

It will be appreciated from the above description that the present embodiment is arranged to pull up only parts of the second-group of wiring patterns to the upper layer and, in principle, to leave the first-group of wiring patterns intact. The arrangement results in providing advantages of making the pull-up of wires more efficient, making an effective use of wiring channels, completing the wiring, enabling the pull-up of parts of all the second-group of wires to the top layer, and making the modification far easier. These advantages make it possible to implement automatic wiring which is capable of effectively using the wiring channels. The LSI produced by this automatic wiring provides the effects of reliably implementing the modification of the LSI itself, easily working the LSI, and improving the yield and reliability.

In the wiring operation of the semiconductor integrated circuit having a wiring multilayer, as stated above, it is possible to define each layer according to the corresponding wiring type for the purpose of making the effective use of the wiring channels. Hence, no necessary wires are left unwired and the modification of the LSI is made possible because all wires to be modified, in part are, pulled up to upper layers.

The present invention has been described with reference to the foregoing embodiments. It, however, goes without saying that the present invention is not limited to these embodiments and additions and modifications to the embodiments are made possible within the scope of the appended claims.

It will be appreciated from the above description that the multilayer wiring method according to the present invention is capable of easily implementing automatic wiring of a semiconductor having four or more wiring layers by using a wiring algorithm for a few wiring layers. Further, since the parts of wiring patterns to be modified are pulled up to the top layer, the modification or repair of the LSI is easily implemented. It results in improving the reliability and yield when modifying or repairing and working the LSI. In the wiring process, only wires to be modified are pulled up to the upper layer. Hence, the waste of the wiring channels resulting from the wiring roundabout in the pull-up of the wires to the upper layer can be reduced in a minimum, thereby effectively preventing the necessary wires from being left unwired.

What is claimed is:

1. A multilayer wiring method for connecting signal wires between circuit elements included in a semiconductor integrated circuit chip having a plurality of wiring layers comprising the steps of:
    classifying said signal wires into a first group of signal wires with low modification-requisite possibility and a second group of signal wires with high modification-requisite possibility;
    allocating said first group of signal wires into at least one lower layer of said plurality of wiring layers; and
    allocating said second group of signal wires into at least one upper layer of said plurality of wiring layers.

2. A multilayer wiring method according to claim 1, wherein said second group of signal wires are used as logical signal wires providing great allowance for a signal delay time.

3. A multilayer wiring method for interconnecting signal wires between cell terminals of circuit elements included in a semiconductor integrated circuit chip having two or more wiring layers, said layers being allocated in accordance with each type of signal wires, said multilayer wiring method comprising the steps of:
    dividing said signal wires into a first group of signal wires with low repair-requisite possibility and a second group of signal wires with high repair-requisite possibility;
    arranging cell terminals of said first group of signal wires and unused cell terminals in a lower layer of said two or more wiring layers to connect the wires; and
    leading cell terminals of said second group of signal wires out to an upper layer of said two or more wiring layers to interconnect the wires therein.

4. A multilayer wiring method according to claim 3, wherein data of paths to be formed when the cell terminals of said second group of signal wires to the upper layer are led out to the upper layer are stored in a library and the lead-out wires for said cell terminals are formed of wiring patterns corresponding to the data stored in said library.

5. A multilayer wiring method according to claim 1, wherein the signal wires are categorized into three levels depending on the modification-requisite possibility thereof, signal wires of the most modification-requisite possibility are allocated into an upper layer of said plurality of wiring layers, signal wires of the least modification-requisite possibility are allocated to a lower layer of said plurality of wiring layers, and signal wires of intermediate-level modification-requisite possibility are allocated to the upper layers using idle wiring paths as modification-requisite possibility of the signal wires become higher.

6. A multilayer wiring method according to claim 1, wherein higher weights are applied to signals of a signal wire group with higher modification-requisite possibility and higher weighted signal wires are allocated to the upper layers when defining a connecting path or wiring layer.

7. A multilayer wiring method according to claim 6, wherein upper layers of said two or more wiring layers are allocated to the weighted signal wire groups in a wire connecting process in order to allocate the higher weighted signal wires to the upper layers.

* * * * *